(12) United States Patent
Min et al.

(10) Patent No.: US 7,230,305 B2
(45) Date of Patent: Jun. 12, 2007

(54) SEMICONDUCTOR MEMORY DEVICE INCLUDING A FLASH MEMORY CELL ARRAY AND A MASK READ-ONLY MEMORY CELL ARRAY

(75) Inventors: Hong-kook Min, Seongnam (KR); Yong-tae Kim, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/875,720

(22) Filed: Jun. 25, 2004

(65) Prior Publication Data

US 2005/0003614 A1      Jan. 6, 2005

(30) Foreign Application Priority Data

Jul. 2, 2003      (KR)   ...................... 10-2003-0044544

(51) Int. Cl.
*H01L 29/76*   (2006.01)

(52) U.S. Cl. .................... 257/390; 365/230.03

(58) Field of Classification Search ........... 365/230.03, 365/185.33; 257/314–316, 321, 390; 438/201, 438/211, 257, 267, 593–595
See application file for complete search history.

(56) References Cited

U.S. PATENT DOCUMENTS

| 4,532,594 | A | * | 7/1985 | Hosaka et al. ............... 701/114 |
|---|---|---|---|---|
| 5,406,514 | A | | 4/1995 | Yoneda |
| 5,879,992 | A | * | 3/1999 | Hsieh et al. ................. 438/264 |
| 6,523,083 | B1 | * | 2/2003 | Lin et al. ..................... 711/103 |
| 6,590,253 | B2 | * | 7/2003 | Chen .......................... 257/314 |
| 6,839,278 | B1 | * | 1/2005 | Lee et al. .............. 365/185.17 |

FOREIGN PATENT DOCUMENTS

| EP | 1 345 273 A1 | * | 9/2003 |
|---|---|---|---|
| JP | 5-304277 | | 11/1993 |
| WO | WO 02/43158 | * | 5/2002 |

* cited by examiner

*Primary Examiner*—David Vu
(74) *Attorney, Agent, or Firm*—Volentine & Whitt, PLLC

(57) ABSTRACT

A semiconductor memory device included in a system-on-chip (SOC) or a microcomputer chip. The semiconductor memory device may include a flash memory cell array unit and a mask read-only memory (ROM) cell array unit which are formed in a single memory block without an isolation layer for separating the two units. Transistors included in the flash memory unit and the mask ROM unit are the same type and may have two threshold voltages. The transistor in each memory cell unit may be a split gate transistor, a metal-oxide-nitride-oxide-silicon, or silicon-oxide-nitride-oxide-silicon transistor. Further, the transistor included in the mask ROM unit in the semiconductor memory device may include enhancement transistors or depletion transistors in which a dopant ion-implanted region is formed at channel portions.

15 Claims, 10 Drawing Sheets

FLASH MEMORY CELL ARRAY REGION | MASK ROM CELL ARRAY REGION

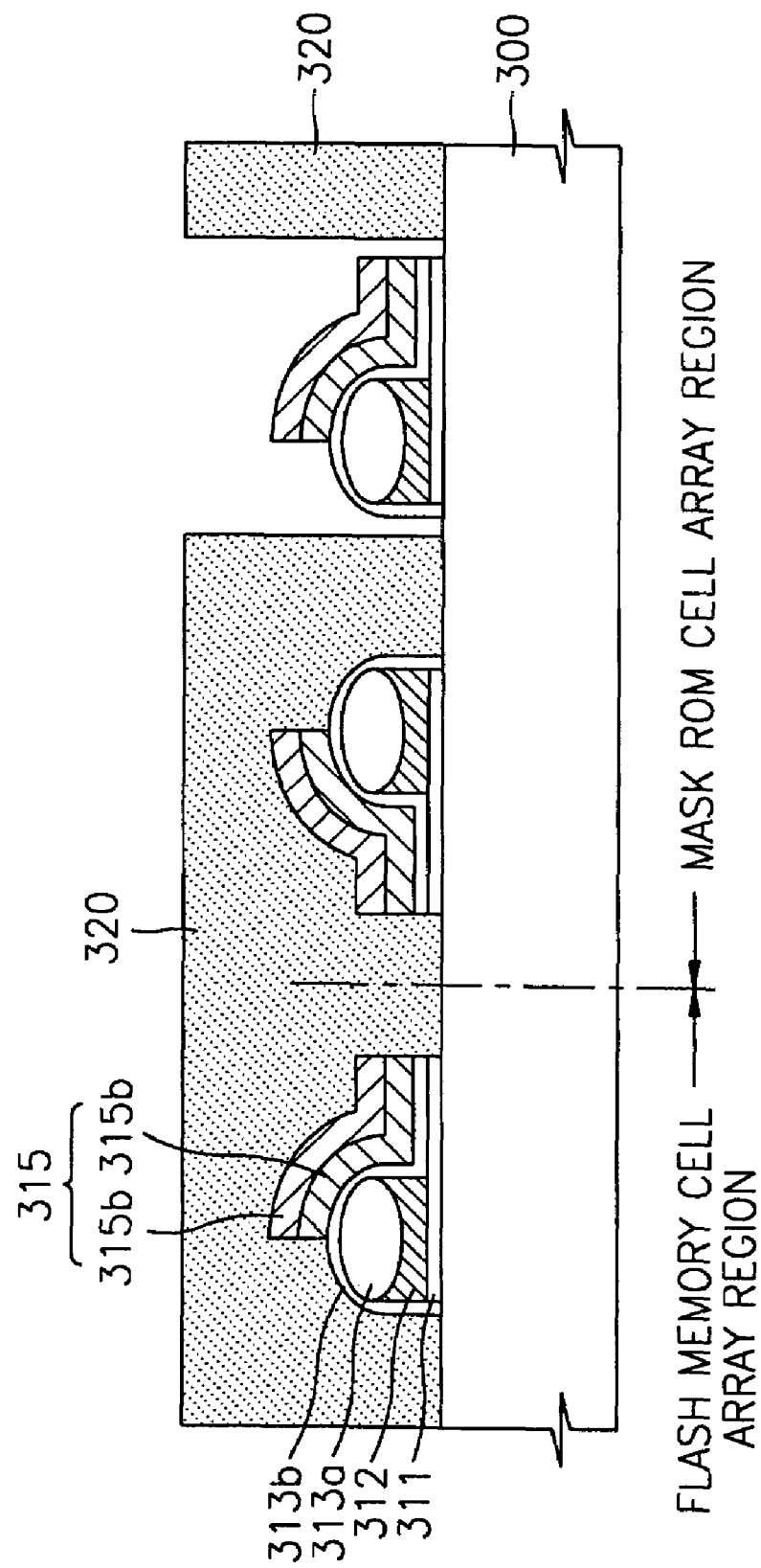

FLASH MEMORY CELL ARRAY REGION | MASK ROM CELL ARRAY REGION

FLASH MEMORY CELL ARRAY REGION | MASK ROM CELL ARRAY REGION

FLASH MEMORY CELL ARRAY REGION | MASK ROM CELL ARRAY REGION

FLASH MEMORY CELL ARRAY REGION | MASK ROM CELL ARRAY REGION

FLASH MEMORY CELL ARRAY REGION | MASK ROM CELL ARRAY REGION

FLASH MEMORY CELL ARRAY REGION | MASK ROM CELL ARRAY REGION

FLASH MEMORY CELL ARRAY REGION | MASK ROM CELL ARRAY REGION

SEMICONDUCTOR MEMORY DEVICE INCLUDING A FLASH MEMORY CELL ARRAY AND A MASK READ-ONLY MEMORY CELL ARRAY

BACKGROUND OF THE INVENTION

1. Field of the Invention

Embodiments of the present invention relate to a semiconductor memory device including a flash memory cell array and a mask read-only memory (ROM) cell array and a method of manufacturing the semiconductor memory device.

This application claims the priority of Korean Patent Application No. 2003-44544, filed on Jul. 2, 2003, in the Korean Intellectual Property Office, the disclosure of which is incorporated herein in its entirety by reference.

2. Description of the Related Art

System-on-chips (SOCs) integrate essential system functions onto one chip. Since both hardware and software are merged and both analog and digital are integrated in the SOCs, a single semiconductor chip can operate as a system. In other words, SOCs can contain all functions in a single semiconductor chip, such as memory, non-memory (large scale integrated circuit (LSI)), analog components, digital components, hardware, and software. SOCs can be applied to various fields of technology, such as a digital systems included in cellular telephones. SOCs are widely applied to high-density and high-performance products. While processes for devices under 0.13 μm have been primarily used in manufacturing semiconductor devices, applications of the SOCs are expanding. SOCs may include a mask read-only memory (ROM), on which various data is coded. SOCs may include a non-volatile memory (NVM) device, such as an electrically erasable and programmable read-only memory (EEPROM) or a flash memory from which a user can program and erase data.

FIG. 1 is a block diagram illustrating an inner configuration of the semiconductor chip 100, which includes an EEPROM and a mask ROM. The semiconductor chip 100 may be a SOC or a microcomputer chip. The semiconductor chip 100 may include the EEPROM block 110, the mask ROM block 120, and the core block 130. The semiconductor chip 100 may further include a buffer memory (not shown) having a static random access memory (SRAM). The core block 130 may include a controller unit (similar to a central processing unit (CPU)) and a logic integrated circuit (IC) comprising analog circuits and digital circuits.

The EEPROM block 110 includes the EEPROM cell array unit 112 (referred to as an EEPROM unit hereinafter) and the peripheral circuit unit 114. A transistor included in the EEPROM unit 112 may be a stack gate transistor having a gate structure in which a floating gate, an insulating layer, and a control gate are stacked. Alternatively, a transistor included in the EEPROM unit 112 may be a split gate transistor having a split gate structure. The peripheral circuit unit 114 may comprise a circuit necessary for programming and erasing data into and from the EEPROM unit 112. The mask ROM block 120 may include a mask ROM cell array unit 122 (referred to as a mask ROM unit hereinafter) and the peripheral circuit unit 124. A transistor included in the mask ROM unit 122 may be a metal oxide semiconductor (MOS) transistor or a stack gate transistor having a gate structure in which a floating gate, an insulating layer, and a control gate are stacked. The peripheral circuit unit 124 may comprise a circuit necessary for reading information stored in the mask ROM unit 122.

The EEPROM block 110 and the mask ROM block 120 have the peripheral circuit units 114 and 124 formed at their peripheries. A relatively large isolation layer is interposed between the EEPROM block 110 and the mask ROM 120 to separate the two blocks. Cell transistors including the EEPROM unit 112 and the mask ROM unit 122 are different types. In particular, a transistor included in the mask ROM unit 122 has a simple MOS gate structure, which is different from a transistor included in the EEPROM unit 112.

FIG. 2 is a schematic cross-section partially illustrating an EEPROM unit and a mask ROM unit. The semiconductor substrate 200 is separated into an EEPROM cell array region (referred to as an EEPROM region hereinafter) and the mask ROM cell array region (referred to as a mask ROM region hereinafter) by the isolation layer 205. The EEPROM region is occupied by the EEPROM block 110 (see FIG. 1) and the mask ROM region is occupied by the mask ROM block 120 (see FIG. 1). FIG. 2 shows cell transistors of the memory cell array units included in the blocks 110 and 120.

The split gate structure 210 in which the gate oxide layer 211, the floating gate 212, the insulating layers 213a and 213b, and the control gate 215 are stacked and formed in the EEPROM region of the semiconductor substrate 200. The floating gate 212 and the control gate 215 may be made of polysilicon, metal, and/or metal silicide. The insulating layer 213a may be a thermal oxidation layer made of polysilicon. The insulating layer 213b may be an oxide layer deposited through a chemical vapor deposition (CVD) process (or similar process). The source region 242 and the drain region 244 are formed in the semiconductor substrate 200 adjacent to the split gate structure 210.

In the mask ROM region, the gate structure 220 including the gate oxide layer 221 and the gate electrode 222 formed on the semiconductor substrate 200. The gate structure 220 may further include an etch stop layer 225, depending on the manufacturing method. The source region 242 and the drain region 244 are formed in the semiconductor substrate 200 adjacent to the gate structure 210. Data may be coded in some cells of the mask ROM region. For example, a dopant ion-implanted region 230 may be formed on a channel portion of an off cell transistor.

The EEPROM block and the mask ROM block are separated from each other. The two blocks are separated by their peripheral circuits formed in the peripheries of the memory cell array units. Also, the two blocks are electrically separated by the isolation layer formed on the semiconductor substrate. Such structures may be obstacles to improvements in the degree of integration of semiconductor memory devices. Data on specific programs of companies selling SOC-embedded products are usually coded in the mask ROM unit. When the mask ROM block and the EEPROM block are formed separately, there is the possibility of leaking information of the programs.

In manufacturing and selling a mask ROM, several tests are performed. Specifically, after determining if programs are properly executed, based on the coded data being repeatedly tested, final goods are produced. During the test, a process of coding the program data is repeated using an EEPROM or a flash memory, instead of the mask ROM. After the test, if errors do not occur, the program data is coded in a mask ROM form and contained in the SOC. However, a cell transistor including in an EEPROM unit or a flash memory unit is different from the kind included in a mask ROM unit. Even if the mask ROM passed the test, the program data is coded using the mask ROM. The test is then conducted again to ensure reliability on products regardless of difference in the cell transistors. As a result, the repeated testing requires a lot of time to confirm if the mask ROM is correctly executing, to ensure reliability.

SUMMARY OF THE INVENTION

Embodiments of the present invention relate to a semiconductor memory device or method of manufacturing a semiconductor device, which can improve the degree of integration of a system-on-chip (SOC) or a microcomputer chip. Embodiments efficiently prevent information on programs coded in a mask read-only memory (ROM) from being leaked and/or reduce the time required for processing ranging from design of the mask ROM to production of the finished product.

A semiconductor memory device according to embodiments of the present invention comprises a memory cell array unit and a mask ROM cell array unit. The semiconductor memory device may be included in an SOC or a microcomputer chip. The flash memory cell array unit and the mask ROM cell array unit may not be electrically separated from each other by an additional isolation layer, but are formed in parallel within one memory block.

According to embodiments of the present invention, transistors included in a semiconductor memory device of a mask ROM cell array unit and a flash memory cell array unit are split gate transistors. The mask ROM cell array unit and the flash memory cell array unit may be formed in parallel within a single memory block. According to embodiments of the present invention, the split gate transistors included in the mask ROM cell array unit includes a plurality of depletion transistors or a plurality of enhancement transistors. Channel portions of the transistors included in the mask ROM cell array unit in which data are coded may include a dopant ion-implanted region. The dopant ion-implantation region may be formed through ion implantation. In the dopant ion-implanted region, a threshold voltage of the cell transistor included in the mask ROM cell array unit may become higher or lower than a threshold voltage of the cell transistor included in the flash memory cell array unit. A memory cell including the cell transistor whose threshold voltage becomes higher or lower always is in an off cell or an on cell. Boron, phosphorous, arsenic or indium ions may be implanted into the dopant ion-implanted region.

According to embodiments of the present invention, a control gate of the split gate transistor is made of metal silicide (e.g. tungsten silicide, cobalt silicide, or titanium silicide). According to embodiments, the split gate transistor included in a flash memory cell array unit erases data through Fowler-Nordheim (F-N) tunneling and/or programs data through channel hot electron injection (CHEI). The spit gate transistor included in the flash memory cell array unit may erase and write data through F-N tunneling.

According to embodiments of the present invention, transistors included in a mask ROM cell array unit and a flash memory cell array unit are metal-oxide-nitride-oxide-silicon (MONOS) gate transistors or silicon-oxide-nitride-oxide-silicon (SONOS) gate transistors. A mask ROM cell array unit and a flash memory cell array unit may be formed in parallel within one memory block. Gate structures of MONOS or SONOS transistors may be structured such that an oxide layer, a nitride layer, and an oxide layer are stacked and the thickness of the nitride layer is less than the oxide layers.

According to embodiments of the present invention, a method of manufacturing a semiconductor memory device includes a flash memory cell array unit and a mask ROM cell array unit which are formed in parallel within one memory block. The method may comprise at least one of the following. Forming a plurality of split gate structures, each of the split gate structures including a gate oxide layer, a floating gate, an insulating layer, and a control gate stacked on a semiconductor substrate on which a flash memory region and a mask ROM region are defined. Forming a material layer pattern which exposes a top surface of a predetermined split gate structure, in which data are to be coded, among the split gate structures that are formed on the mask ROM region of the semiconductor substrate. Implanting dopant ions into the semiconductor substrate under the split gate structure exposed by the material layer pattern. Removing the material layer pattern. Forming a source region and a drain region in the semiconductor substrate through ion implantation. The source and drain regions may be formed after the data are coded through ion implantation. According to embodiments, the source and drain regions may be formed before the material layer pattern is formed.

According to embodiments of the present invention, a method of manufacturing a semiconductor memory device includes a flash memory cell array unit and a mask ROM cell array unit which are formed in parallel within one memory block. The method may comprise at least one of the following. Forming a material layer pattern which exposes a predetermined portion of a mask ROM region on a semiconductor substrate on which a flash memory region and a mask ROM region are defined. Implanting dopant ions into a predetermined portion of a semiconductor substrate exposed by the material layer pattern and removing the material layer pattern. Forming a plurality of split gate structures, each of the split gate structures including a gate oxide layer, a floating gate, an insulating layer, and a control gate on a flash memory region and a mask ROM region. Forming a source region and a drain region in the semiconductor substrate through ion implantation.

BRIEF DESCRIPTION OF THE DRAWINGS

FIGS. 3A through 3D are example schematic cross-sections of a semiconductor memory device and a method of manufacturing the semiconductor memory device.

DETAILED DESCRIPTION OF THE INVENTION

FIGS. 3A through 3D are example schematic cross-sections of a semiconductor memory device according to embodiments of the present invention and a method of manufacturing the semiconductor memory device.

Figure 3A:
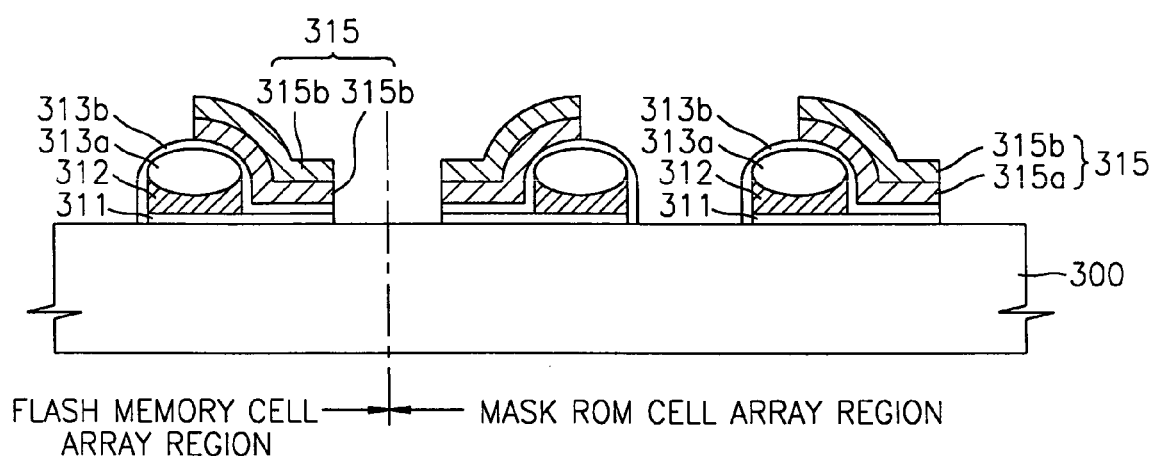

Referring to FIG. 3A, a plurality of gate structures are formed on the semiconductor substrate 300 on which a flash memory region and a mask read-only memory (ROM)

region are defined. The flash memory region is a region on which a flash memory unit and its peripheral circuit are formed. The mask ROM region is a region on which a mask ROM unit and its peripheral circuit are formed. In embodiments, each of the gate structures of the flash memory region and the mask ROM region are split gate structures.

The split gate structure may be formed by the following steps. A first oxide layer is formed on the entire surface of the semiconductor substrate 300 to form a gate oxide layer. For example, the first oxide layer may be formed by thermally oxidizing the semiconductor substrate 300. Next, a first polysilicon layer may be formed with a predetermined thickness on the first oxide layer to form a control gate 312, and a patterning process may be performed through photolithography. Subsequently, the first polysilicon layer may be thermally oxidized. As a result, the control gate 312 and the thermal oxidation layer pattern 313a disposed on the control gate 312 are formed, as shown in FIG. 3A. Subsequently, a second oxide layer is formed on the entire surface of the resultant object using chemical vapor deposition (CVD) or a similar process. The second oxide layer and the first oxide layer are patterned through photolithography, such that the gate oxide layer 311 and the oxide layer pattern 313b remain as shown in FIG. 3A.

A process for forming a control gate 315 is performed, as illustrated in FIG. 3A. The control gate 315 may be made of metal silicide. Alternatively, the control gate can be made of only polysilicon or metal material. To form the control gate 315 made of silicide, polysilicon is deposited along a stepped portion on the resultant object to form a second polysilicon layer. A metal layer may be formed on the deposited polysilicon layer. The metal layer may be made of tungsten, cobalt, or titanium. The metal layer and the second polysilicon layer may be patterned through photolithography, so that the control gate 315 including a polysilicon pattern 315a and a metal layer pattern 315b are formed, as shown in FIG. 3A.

Referring to FIG. 3B, a material layer pattern 320 is formed on the entire surface of the semiconductor substrate 300 on which the split gate structures are formed. The material layer pattern 320 is formed to cover all of the flash memory region. The material layer pattern 320 is formed higher than the split gate structures in such a manner as to expose only the top surface of gate structures to be coded among the split gate structures that are formed on the mask ROM region. The material layer pattern 320 may be a photoresist, in embodiments. However, in embodiments, the material layer pattern 320 may be made of an insulating material (e.g. silicon oxide, silicon nitride, or silicon oxynitride).

Figure 3C:
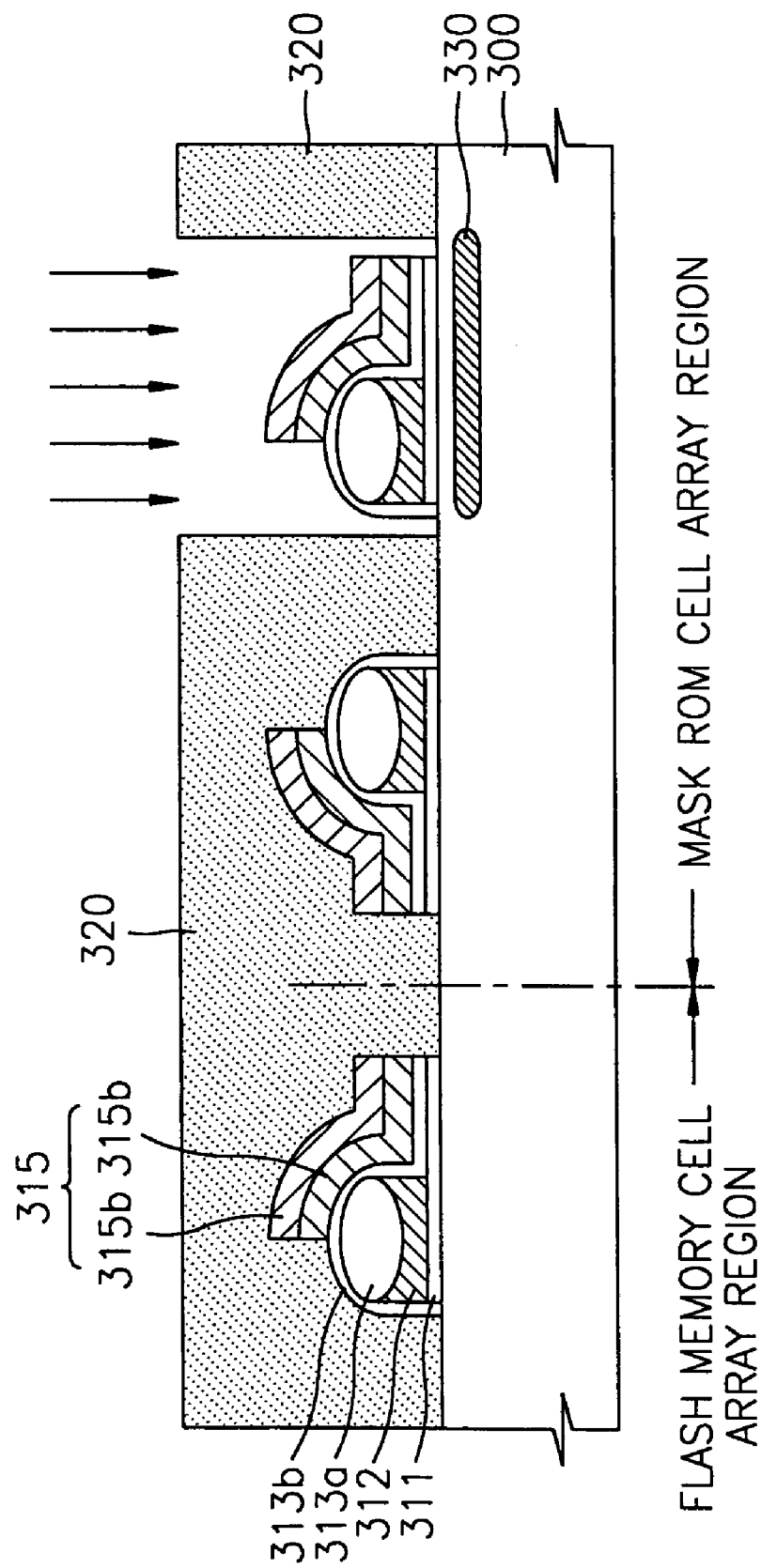

Referring to FIG. 3C, a process of implanting dopant ions into a channel portion of a cell transistor formed on the mask ROM region may be performed. The dopant ion implantation process may be performed in the same way as a method of manufacturing a general mask ROM. For example, a dopant ion-implanted layer 330 is formed in the semiconductor substrate under the exposed gate structure by using the material layer pattern 320 as a mask. That is, the dopant ion-implanted layer 330 is formed on the channel portion of the cell transistor with a charged threshold voltage.

The implanted dopant ions may be a material containing 3B group elements or 5B group elements (e.g. boron B, phosphorous P, boron fluoride $BF_2$, arsenic As, or Indium In). The sources of the dopant ions may be used to manufacture a depletion transistor or an enhancement transistor, according to the conductive characteristics of the semiconductor substrate. For example, when a p-type semiconductor substrate is used, if dopant ions containing 3B group elements may be implanted to form a depletion transistor. The depletion transistor has a minus (−) threshold voltage. The depletion transistor maintains an ON state even though a zero (0) voltage is applied to a gate electrode. If dopant ions containing 5B group elements are implanted into the p-type semiconductor substrate, an enhancement transistor is formed to have a threshold voltage higher than an operating voltage of the cell transistor in the flash memory region. Accordingly, the enhancement transistor maintains an OFF state even though an operating voltage is applied to a gate electrode of the flash memory region.

Figure 3D:
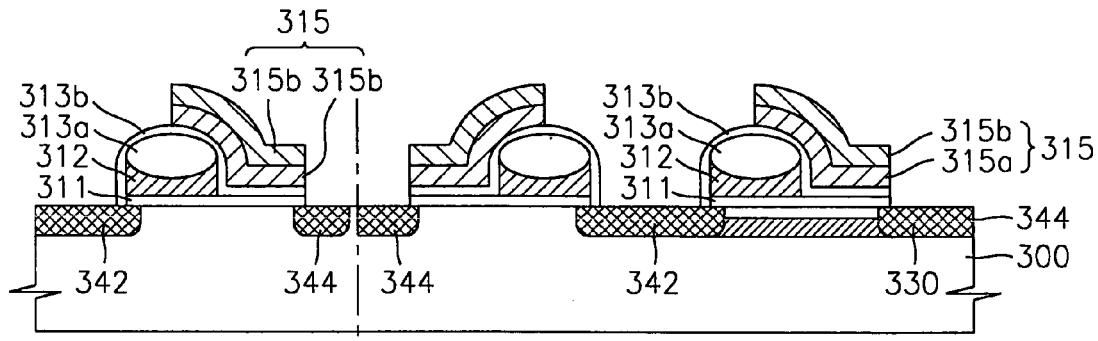

A process of forming a source region 342 and a drain region 344 is performed, as illustrated in FIG. 3D. The material layer pattern 320 may be removed from the semiconductor substrate 300. Then, ions may be implanted into the semiconductor substrate 300 adjacent to the gate structures. The gate structures of the cell transistors may be used as a mask in the ion implantation process to form the source region 342 and the drain region 344.

The cell transistor in the flash memory region may be a device which programs data through channel hot electron injection (CHEI) and erases data through F-N tunneling. Alternatively, the cell transistor in the flash memory region may be a device which programs and erases data through F-N tunneling.

The semiconductor memory device according to embodiments appears to be similar to a flash memory device in which a plurality of memory cells, including split gate transistors, are arrayed. However, some memory cells of the semiconductor memory device, according to embodiments, form the mask ROM unit having the dopant ion-implanted layer on its channel portion. The remaining memory cells form a flash memory unit with which a user can program and erase data. In other words, the semiconductor memory device is characterized in that both the flash memory unit and the mask ROM unit may be formed in parallel within one memory block. Accordingly, in embodiments, the semiconductor memory device can achieve a higher degree of integration than a semiconductor memory device including a flash memory unit and a mask ROM unit which are formed in different blocks. Additionally, in embodiments, since the flash memory unit and the mask ROM unit are not divided, data on various programs coded in the mask ROM are not easily leaked. Although the cell transistors included in the mask ROM unit are manufactured as split gate transistors, it can be manufactured at the same time as the cell transistors included in the flash memory unit, thereby eliminating necessity of additional process during manufacturing.

Figure 4A:
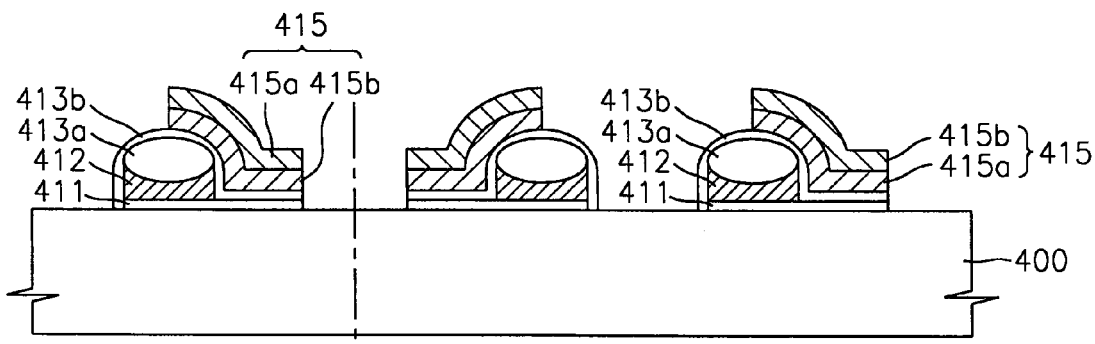
FIGS. 4A through 4D are example schematic cross-sections of a semiconductor memory device and a method of manufacturing the semiconductor memory device.

An example semiconductor memory device and a method of manufacturing the semiconductor memory device, according to embodiments of the present invention, are illustrated in FIGS. 4A through 4D. Referring to FIG. 4A, split gate structures are formed on a semiconductor substrate 400 on which a flash memory region and a mask ROM region are defined. Each of the split gate structures includes a gate oxide layer 411, a floating gate 412, oxide layers 413a and 413b, and a control gate 415 having a polysilicon pattern 415a and a metal layer pattern 415b, similar to the split gate structure illustrated in exemplary FIGS. 3A and 3D.

Figure 4B:
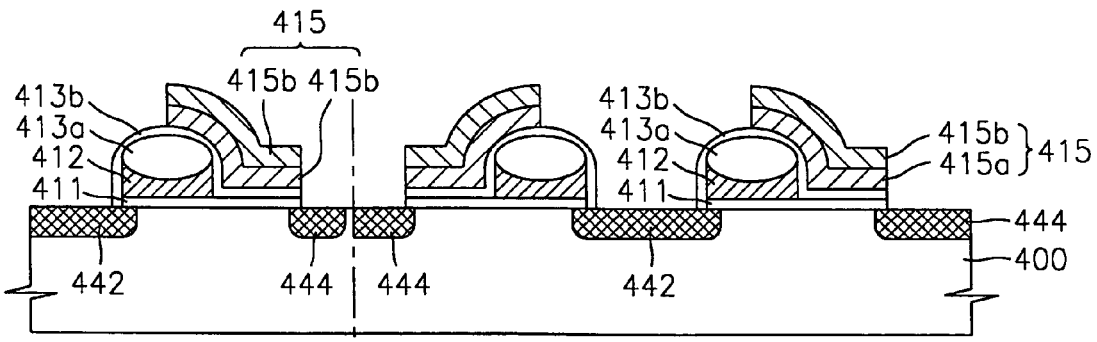
Figure 4C:
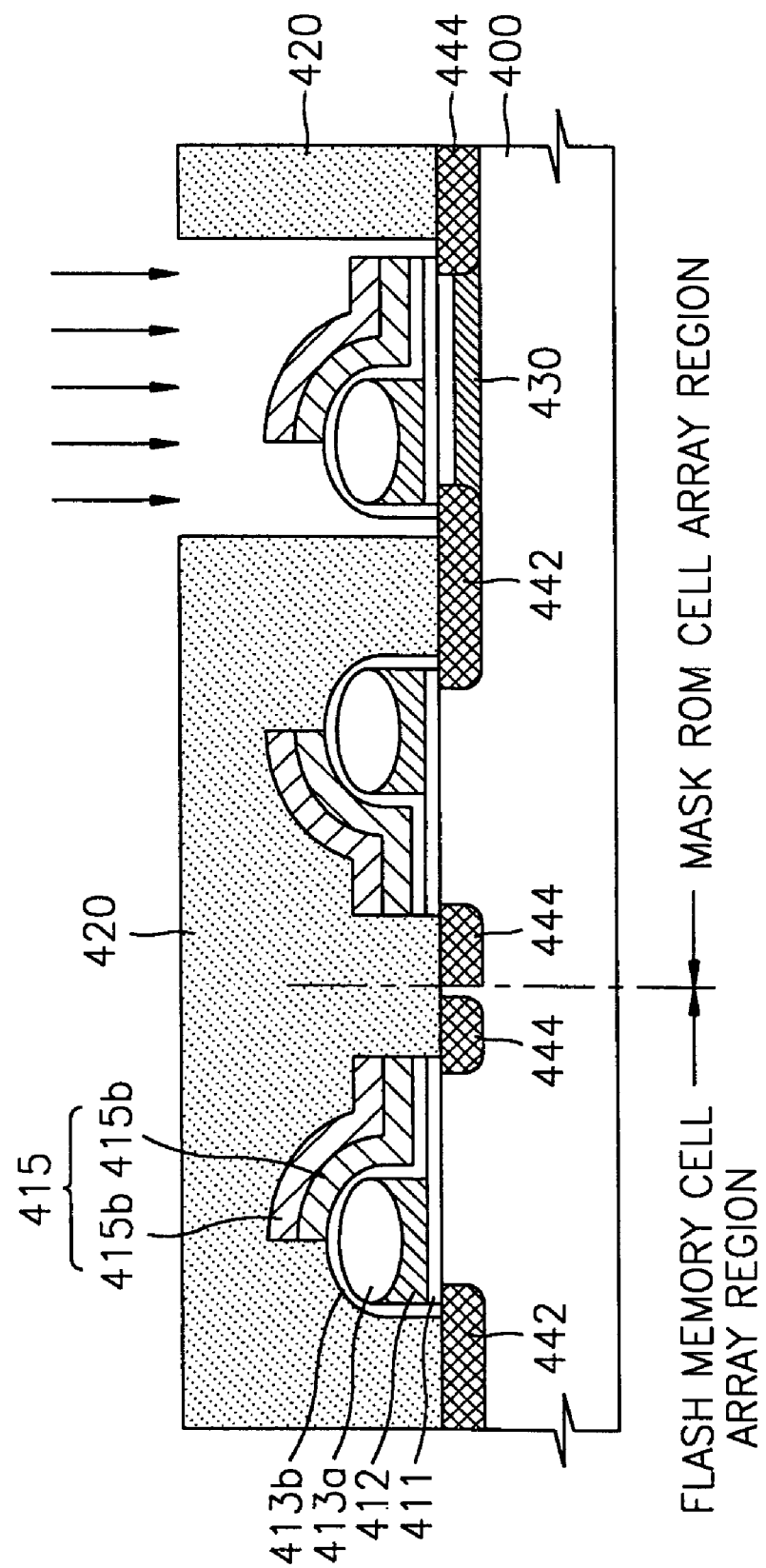
Figure 4D:
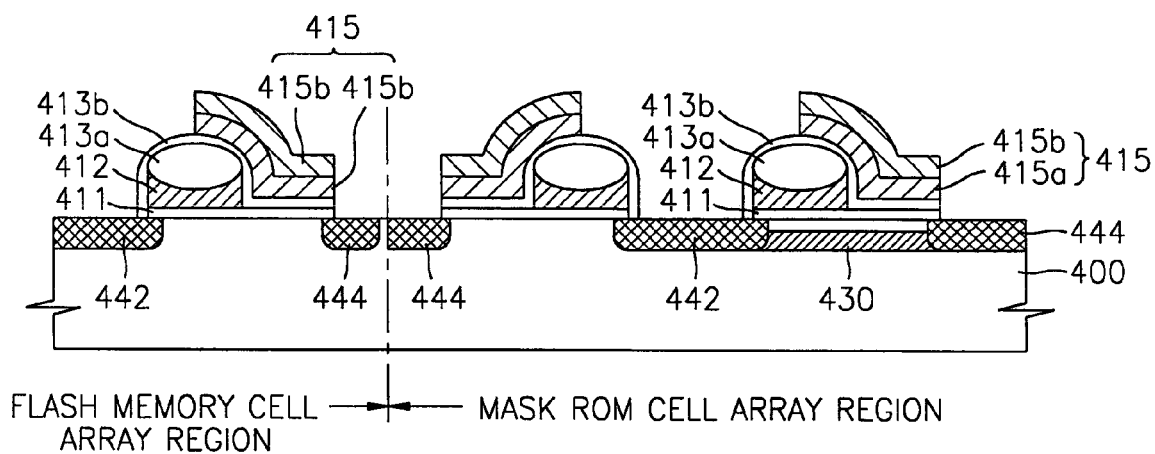

Referring to FIG. 4B, an ion implantation process is performed to form the source region 442 and the drain region 444. The source region 442 and the drain region 444 may be formed according to data being coded in a cell transistor included in a mask ROM region. Referring to FIG. 4C, a material layer pattern 420, exposing a top surface of a gate structure, is formed on the semiconductor substrate 400 in which the source region 442 and the drain region 444 are formed. The material layer pattern 420 may be formed in the same pattern and way as described in association with FIGS. 3A and 3D. A dopant ion-implanted region 430 is formed by implanting dopant ions into the semiconductor substrate 400 under the exposed gate structure. The material layer pattern 420 is removed, so that the semiconductor memory device can be formed as illustrated in FIG. 4D.

Figure 5A:
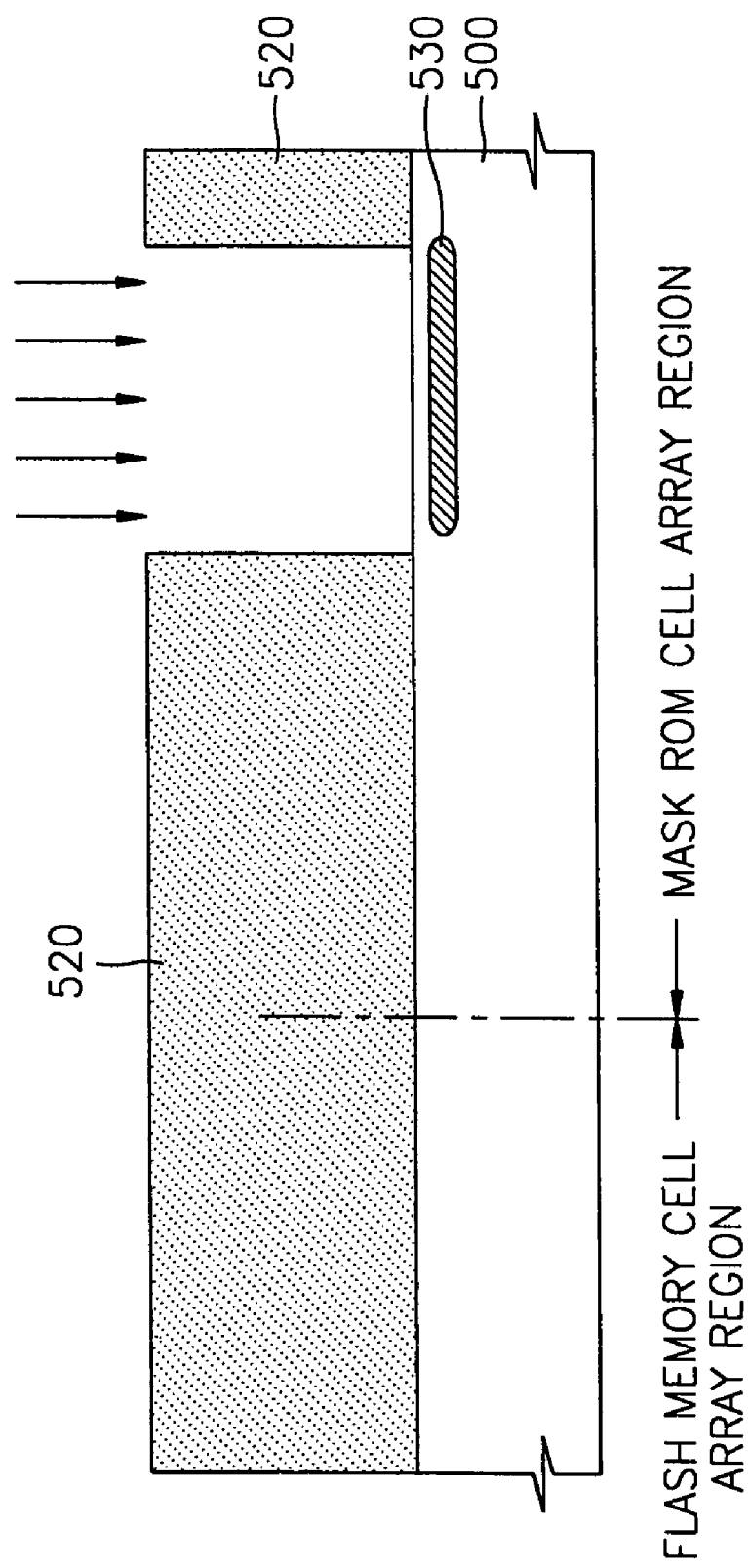
FIGS. 5A through 5C are example schematic cross-sections of a semiconductor memory device and a method of manufacturing the semiconductor memory device.
Figure 5B:
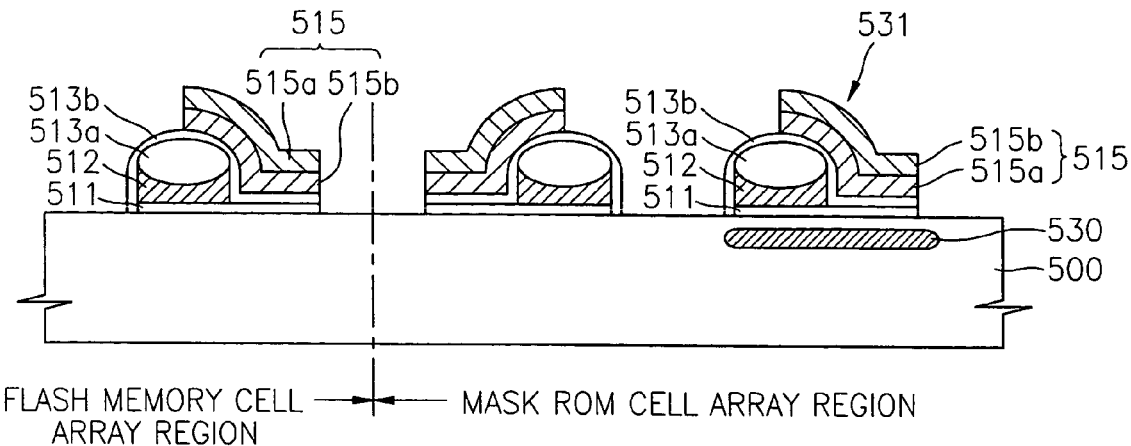
Figure 5C:
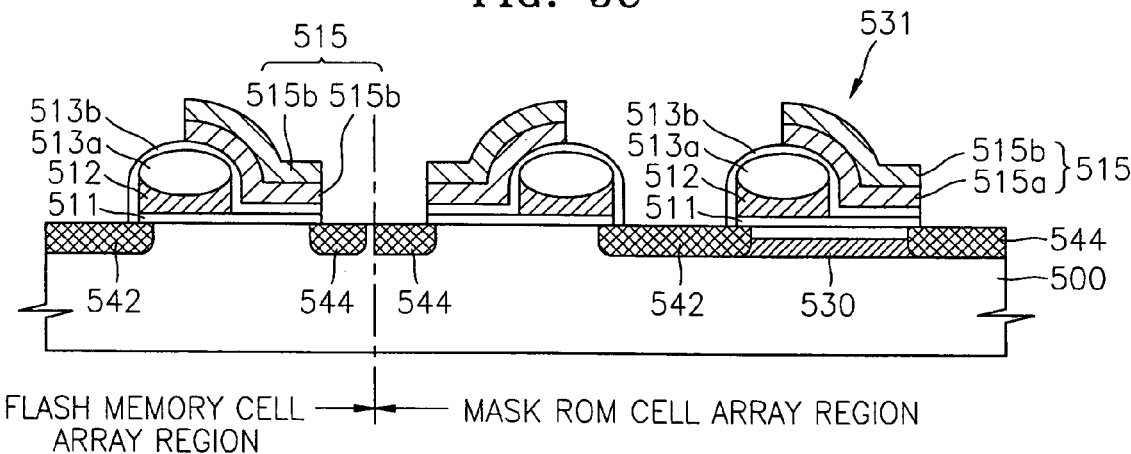

FIGS. 5A through 5C are example illustrations of a semiconductor memory device and a method of manufacturing the semiconductor memory device, according to embodiments of the present invention. Referring to FIG. 5A, the material layer pattern 520 is formed on the semiconductor substrate 500. The dopant ion-implanted region 530 may be formed by implanting dopant ions into the semiconductor substrate 500 using the material layer pattern 520 as a mask. The material layer pattern 520 may be made of photoresist, but in other embodiments can be made of an insulating layer (e.g. an oxide layer and a nitride layer), similar to the embodiments illustrated in FIGS. 3A through 3D. The material layer pattern 520 is formed to expose a predetermined portion of the semiconductor substrate 500. The exposed predetermined portion is a portion on which a cell transistor, including the dopant ion-implanted region 530 in a mask ROM region, is to be formed.

Referring to FIG. 5B, split gate structures are formed on the semiconductor substrate 500. Each of the split gate structures include the gate oxide layer 511, the floating gate 512, oxide layers 513a and 513b, and control gates 515a and 515b. The split gate structure 531 formed on the mask ROM region is formed over a portion of the semiconductor substrate 500 in which the dopant ion-implanted region 530 is formed. Subsequently, a source region 542 and a drain region 544 are formed in the semiconductor substrate 500 through ion implantation, as illustrated in FIG. 5C.

Figure 6:
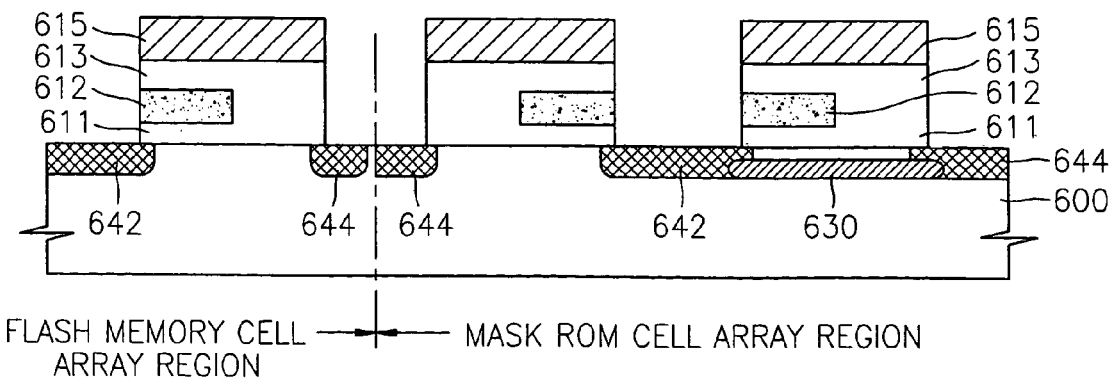
FIG. 6 is an example cross-section of a semiconductor memory device.

FIG. 6 is an example of a schematic cross-section of a semiconductor memory device according to embodiments of the present invention. A flash memory region and a mask ROM region are defined on a semiconductor substrate 600. A flash memory cell array and its peripheral circuit are formed in the flash memory region, and a mask ROM cell array and its peripheral circuit are formed in the mask ROM region. The same type of cell transistors are formed in both the flash memory region and the mask ROM region. In other words, the gate structures of the cell transistors are similar to both the flash memory cell array region and the mask ROM cell array region. The source region 642 and the drain region 644 are formed in the semiconductor substrate at lateral sides of the gate structures. The dopant ion-implanted region 630 is formed on a channel portion of the transistor formed in the mask ROM region. The cell transistors illustrated in FIG. 6 may be silicon-oxide-nitride-oxide-silicon (SONOS) transistors or metal-oxide-nitride-oxide-silicon (MONOS) transistors. An oxide-nitride-oxide (ONO) insulating layer may be interposed between a gate electrode and the substrate. A nitride layer may have a smaller thickness than oxide layers.

In embodiments, each of the gate structures of the cell transistors include at least one of the gate oxide layer 611, the nitride layer 612 (which has a smaller thickness than the gate oxide layer 611 and is formed near to the source region 642), the oxide layer 613 (formed over the gate oxide layer 611 and the nitride layer 612), and a conductive layer (e.g. the gate electrode 615 formed on the oxide layer 613). The gate electrode 615 may be made of polysilicon (e.g. in a SONOS transistor) or may be made of metal (e.g. in a MONOS transistor). In embodiments, the gate electrode 615 may be made of a material containing silicide.

A cell transistor (e.g. the split gate transistor or the SONOS transistor) has two different threshold voltages. For a split gate transistor, a threshold voltage is at a portion where the floating gate and the control gate overlap with each other and is different from a threshold voltage at a portion where the control gate is formed directly above the gate oxide layer 311, 411 or 511. In case of a SONOS transistor, a threshold voltage at a portion where the nitride layer 612 is interposed between the gate electrode 615 and the semiconductor substrate 600 is different from a threshold voltage at a portion where the nitride layer 612 is not formed.

Such a structure having different threshold voltages according to positions of one cell transistor has some advantages. For example, in embodiments, the flash memory region and the mask ROM region are not electrically separated by an additional isolation layer. In this case, when the same type of cell transistors are used in the flash memory region and the mask ROM region, if a high voltage is applied to the semiconductor substrate 300, 400, 500, or 600 to erase data from the flash memory region, a high voltage is also applied to the semiconductor substrate of the mask ROM region. In these circumstances, electrons trapped in the floating gate 312, 412, or 512 or the nitride layer 612 move to the semiconductor substrate. Otherwise, if free electrons are introduced into the semiconductor substrate during an erase operation in the cell transistor of the mask ROM region, the introduced electrons may be left in the channel of the mask ROM cell transistor and change the threshold voltage. If the threshold voltage is changed, the mask ROM unit cannot fulfil its function and an SOC or a microcomputer chip including the mask ROM unit may not operate properly.

However, the cell transistor included in the mask ROM unit of the semiconductor memory device according to embodiments the present invention has two different threshold voltages, according to the structure. That is, although a high voltage is applied to the semiconductor substrate, electrons are not introduced into a channel portion in which no floating gate or no nitride layer is formed. As a consequence, it is possible to maintain an initially set threshold voltage at the channel portion. Therefore, although the program operation and erase operation are repeated many times in the flash memory unit, electric characteristics of the cell transistor including the mask ROM unit do not deteriorate.

Figure 1:
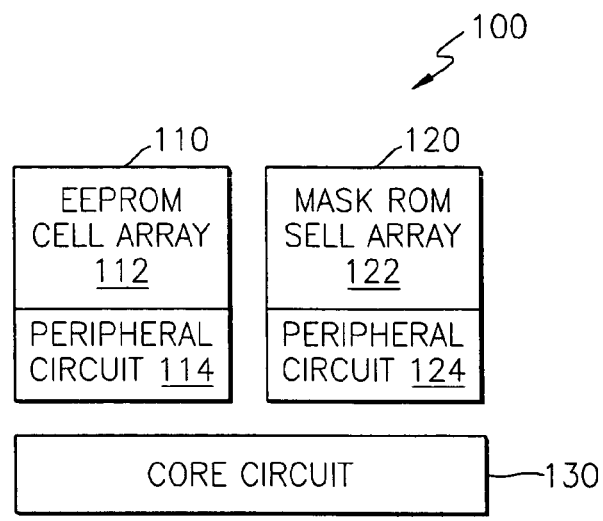
FIG. 1 is a block diagram illustrating an inner configuration of a system-on-chip (SOC).
Figure 2:
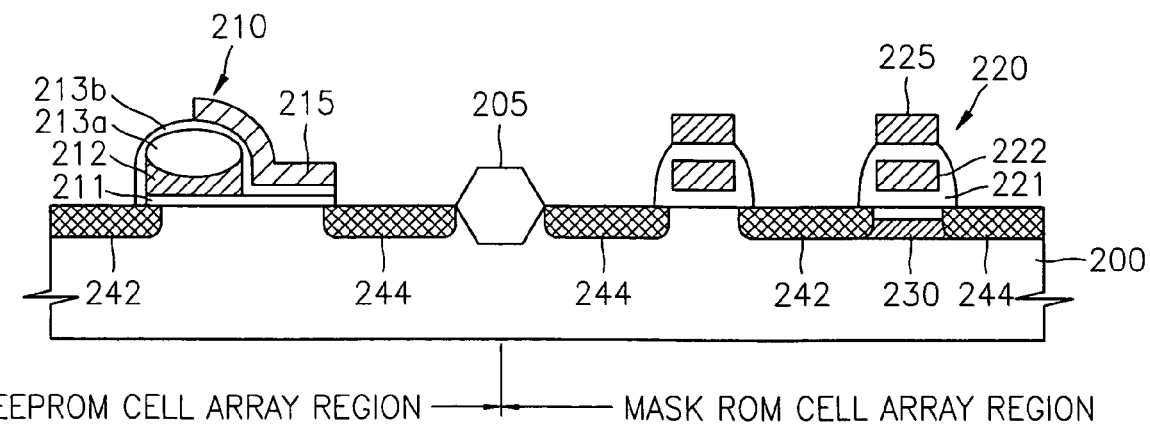
FIG. 2 is a schematic cross-section of a semiconductor memory device.
Figure 7:
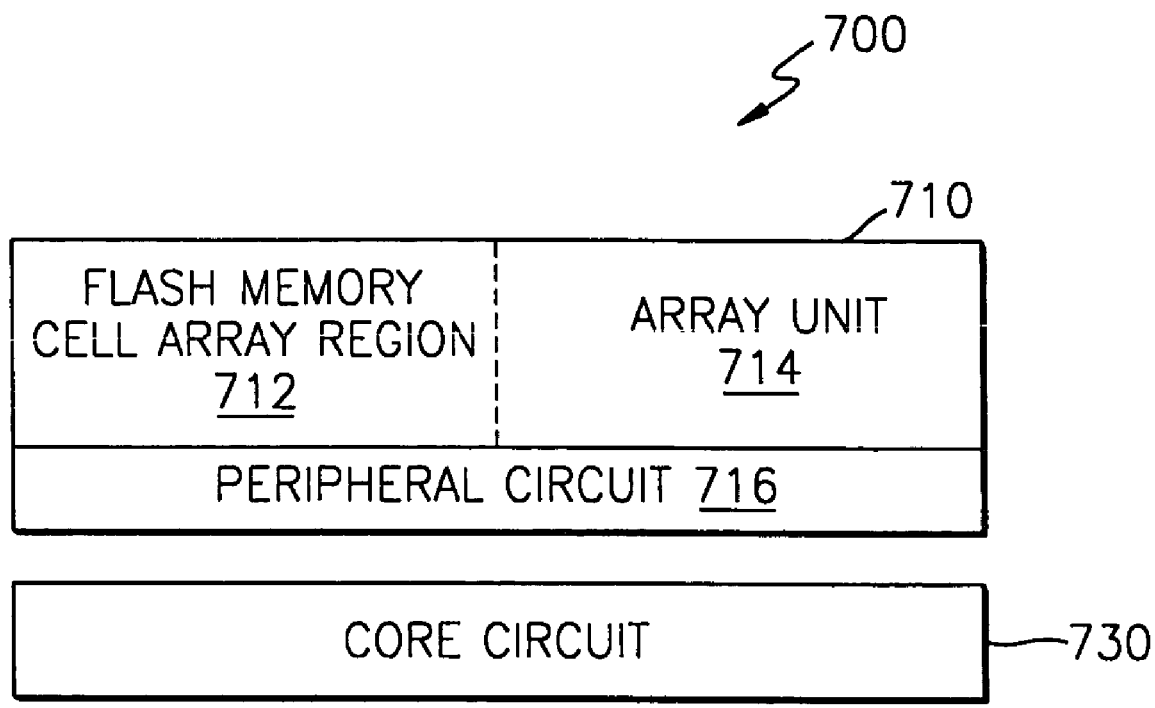
FIG. 7 is an example block diagram illustrating an inner configuration of an SOC including a semiconductor memory device.

FIG. 7 is a schematic block diagram illustrating an inner configuration of an SOC or a microcomputer chip including a semiconductor memory device according to embodiments of the present invention. The SOC 700 includes the memory block 710 and the core circuit 730. When compared with the semiconductor chip 100 of FIG. 1, the semiconductor chip 700 including the semiconductor memory device does not have the flash memory unit 712 and the mask ROM unit 714 formed in separate blocks. In other words, both the flash memory unit 712 and the mask ROM unit 714 are included in one memory block. One peripheral circuit 716 is commonly formed with respect to the units 712 and 714.

According to embodiments of the present invention, spaces for separately accommodating the flash memory unit and the mask ROM unit are not necessary and one peripheral circuit can be commonly formed in the flash memory unit and the mask ROM unit. Hence, the semiconductor memory device may improve the degree of integration and the SOC or the microcomputer chip can be employed in a high-performance and high-density memory device.

Since the cell transistors of the flash memory unit and the mask ROM unit are the same type, various programs stored in the mask ROM unit can be effectively prevented from being leaked. In addition, since the same type of cell transistors can be properly assigned to the flash memory unit and the mask ROM unit for their purposes, they can be appropriately applied to a variety of products. Furthermore, since the structure of the cell transistor including the mask ROM unit is equal to that of the cell transistor including the flash memory unit, the time required to manufacture the mask ROM can be minimized. Further, the cell transistors for both the flash memory unit and the mask ROM unit can be manufactured at the same time, thus simplifying manufacturing.

While the present invention has been particularly shown and described with reference to example embodiments, it is understood by those of ordinary skill in the art that various changes in form and details may be made therein without departing from the spirit and scope of embodiments of the present invention as defined by the following claims.

What is claimed is:

1. A semiconductor memory device comprising a flash memory cell array unit and a mask read-only memory cell array unit, wherein:
    transistors included in the mask read-only memory cell array unit and the flash memory cell array unit are split gate transistors; and
    the mask read-only memory cell array unit and the flash memory cell array unit are formed in parallel in a single memory block.

2. The semiconductor memory device of claim 1, wherein the split gate transistors included in the mask read-only memory cell array unit includes a plurality of depletion transistors or a plurality of enhancement transistors.

3. The semiconductor memory device of claim 2, wherein:
    dopant ions are implanted into channels of the depletion transistors and the enhancement transistors; and
    the dopant ions are at least one of boron, phosphorous, arsenic, and indium.

4. The semiconductor memory device of claim 1, wherein control gates of the split gate transistor is made of metal silicide.

5. The semiconductor memory device of claim 4, wherein the metal silicide is at least one of tungsten silicide, cobalt silicide, and titanium silicide.

6. The semiconductor memory device of claim 1, wherein the split gate transistors included in the flash memory cell array unit erases data through Fowler-Nordheim tunneling and programs data through channel hot electron injection.

7. The semiconductor memory device of claim 1, wherein the split gate transistors included the flash memory cell array unit erases and programs data through Fowler-Nordheim tunneling.

8. A semiconductor memory device comprising a flash memory cell array unit and a mask read-only memory cell array unit, wherein:
    transistors included in the mask read-only memory cell array unit and the flash memory cell array unit are silicon-oxide-nitride-oxide-silicon gate transistors in which a nitride layer with a horizontal length less than oxide layers is interposed between the oxide layers; and
    the mask read-only memory cell array unit and the flash memory cell array unit are formed in parallel in a single memory block.

9. A semiconductor memory device comprising a flash memory cell array unit and a mask read-only memory cell array unit, wherein:
    transistors included in the mask read-only memory cell array unit and the flash memory cell array unit are metal-oxide-nitride-oxide-silicon gate transistors in which a nitride layer with a horizontal length less than oxide layers is interposed between the oxide layers; and
    the mask read-only memory cell array unit and the flash memory cell array unit are formed in parallel in a single memory block.

10. A semiconductor memory device comprising:
    a semiconductor substrate;
    a plurality of flash memory cells located in a first region of the substrate; and
    a plurality of mask read-only-memory (ROM) cells located in a second region of the substrate;
    wherein a transistor structure of the flash memory cells is the same as a transistor structure of the mask ROM cells.

11. The semiconductor memory device of claim 10, wherein the transistor structure of the flash memory cells and the mask ROM cells is a split gate transistor structure.

12. The semiconductor memory device of claim 10, wherein the transistor structure of the flash memory cells and the mask ROM cells is a metal-oxide-nitride-oxide-silicon (MONOS) gate transistor structure.

13. The semiconductor memory device of claim 10, wherein the transistor structure of the flash memory cells and the mask ROM cells is a silicon-oxide-nitride-oxide-silicon (SONOS) gate transistor structure.

14. The semiconductor memory device of claim 10, further comprising a common peripheral circuit located on the substrate and operatively connected to the flash memory cells and the mask ROM cells.

15. The semiconductor memory device of claim 14, further comprising a core circuit located on the substrate.

* * * * *